(12) United States Patent
Suga

(10) Patent No.: US 8,507,359 B2
(45) Date of Patent: Aug. 13, 2013

(54) SEMICONDUCTOR DEVICE, PROCESS FOR PRODUCING SAME, AND DISPLAY DEVICE

(75) Inventor: Katsuyuki Suga, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/511,377

(22) PCT Filed: Oct. 19, 2010

(86) PCT No.: PCT/JP2010/068371
§ 371 (c)(1),
(2), (4) Date: May 23, 2012

(87) PCT Pub. No.: WO2011/067991
PCT Pub. Date: Jun. 9, 2011

(65) Prior Publication Data
US 2012/0273831 A1 Nov. 1, 2012

(30) Foreign Application Priority Data
Dec. 2, 2009 (JP) .................................. 2009-274781

(51) Int. Cl.
*H01L 21/30* (2006.01)
(52) U.S. Cl.
USPC .................................. 438/455; 257/E21.094
(58) Field of Classification Search
USPC .......... 438/455–459, 666–668; 257/E21.094
See application file for complete search history.

(56) References Cited

U.S. PATENT DOCUMENTS

| 6,559,905 | B1 * | 5/2003 | Akiyama ........................ 349/45 |
| 2002/0064032 | A1 * | 5/2002 | Oohata ........................ 361/760 |
| 2003/0227584 | A1 * | 12/2003 | Onozuka et al. ................ 349/61 |
| 2004/0235267 | A1 * | 11/2004 | Sheats et al. .................. 438/455 |
| 2004/0266168 | A1 * | 12/2004 | Koyanagi ...................... 438/622 |

FOREIGN PATENT DOCUMENTS

| JP | 11-142878 A | 5/1999 |
| JP | 2001-007340 A | 1/2001 |
| JP | 2002-118124 A | 4/2002 |
| JP | 2003-289136 A | 10/2003 |
| JP | 2003-297974 A | 10/2003 |
| WO | 03/041167 A1 | 5/2003 |

OTHER PUBLICATIONS

Official Communication issued in International Patent Application No. PCT/JP2010/068371, mailed on Jan. 25, 2011.

* cited by examiner

*Primary Examiner* — Matthew W Such
*Assistant Examiner* — Ali Naraghi
(74) *Attorney, Agent, or Firm* — Keating & Bennett, LLP

(57) ABSTRACT

A wire (24) and a pixel electrode (25) are formed on a surface of a flat supporting substrate (21) which surface is opposite to a surface on which a TFT (16) is formed. Accordingly, it is possible to provide an active matrix substrate (2) which makes it possible to suppress a decline in yield.

11 Claims, 8 Drawing Sheets

SEMICONDUCTOR DEVICE, PROCESS FOR PRODUCING SAME, AND DISPLAY DEVICE

TECHNICAL FIELD

The present invention relates to (i) a process for producing a semiconductor device, (ii) a semiconductor device produced by the process, and (iii) a display device including the semiconductor device.

BACKGROUND ART

In recent years, in the field of semiconductor device, especially in the field of display device, there are demands for further improvement in performance without an increase in cost. Specifically, there are demands for formation of higher-performance elements (e.g., semiconductor elements formed from a monocrystalline semiconductor) on a large-sized substrate of a semiconductor device or a display device at lower cost.

In such fields, there have been attempts to use, as a device substrate, a film substrate or the like, which has high impact resistance, light weight, and flexibility, in order to allow the device to have improved impact resistance, reduced weight, and flexibility.

However, such a film substrate has a low heat resistance of approximately 200° C. Currently, a process using amorphous silicon or polycrystalline silicon which involves a high temperature (approximately in a range from 350° C. to 600° C.) process is widely used as a semiconductor element formation process. It is difficult to directly apply this semiconductor element formation process to formation of semiconductor elements on a film substrate.

Although it is of course possible to form semiconductor elements on a film substrate by using a low temperature (200° C. or less) process, properties of semiconductor elements formed by such a low temperature process are remarkably inferior to those of semiconductor elements formed by a high temperature process.

On this account, there are demands that semiconductor elements formed by using a high temperature process be provided on a film substrate.

A method using a transfer process is known as a method for allowing high performance elements to be provided on a large-sized substrate of a semiconductor device or a display device at low cost, e.g., a method for allowing semiconductor elements formed by using a high temperature process to be provided on a film substrate which has low heat resistance of approximately 200° C.

It is difficult to form, for example, a monocrystalline semiconductor layer, which is necessary for formation of high-performance elements, directly on a large-sized substrate of a semiconductor device or a display device. However, use of the transfer process eliminates the need for such direct formation which causes an increase in cost.

Specifically, a substrate having a monocrystalline semiconductor layer of a size that is relatively easy to form is prepared. Then, semiconductor elements are formed from the monocrystalline semiconductor layer in high density. Subsequently, the semiconductor elements thus formed in high density are transferred onto a large-sized substrate of a semiconductor device or a display device. In this way, the semiconductor elements formed from the monocrystalline semiconductor can be provided on the large-sized substrate of the semiconductor device or the display device at low cost.

Moreover, use of the transfer process allows semiconductor elements to be transferred onto a low-heat-resistance film substrate after the semiconductor elements are formed on a high-heat-resistance substrate by using a high temperature process. In this way, the semiconductor elements formed by using the high temperature process can be provided on the low-heat-resistance film substrate.

For example, Patent Literature 1 discloses a method for producing a liquid crystal display device with the use of a transfer process.

FIG. 7 is a diagram explaining a process of forming thin film transistors 102 on a substrate 301 with the use of a transfer process.

Explained first is a transfer process of transferring thin film transistors 102 from an element formation substrate 401, which is a substrate on which the thin film transistors 102 are first formed, onto an intermediate transfer substrate 701. Explained next is a transfer process of transferring the thin film transistors 102 from the intermediate transfer substrate 701 onto the substrate 301.

First, as illustrated in FIG. 7, an etching stopper layer 402 and an undercoat layer 305 are successively laminated on the element formation substrate 401. The thin film transistors 102 are formed on the undercoat layer 305. Further, protection films 601 are formed so as to cover the respective thin film transistors 102.

Then, dry-etch or the like is performed to remove the etching stopper layer 402 and the undercoat layer 305 except for regions covered by the protection films 601 which are formed so as to cover the respective thin film transistors 102. Thus, the etching stopper layer 402 and the undercoat layer 305 are separated into portions corresponding to the respective thin film transistors 102.

Meanwhile, on the intermediate transfer substrate 701, light absorbers 702 are provided on positions corresponding to the respective thin film transistors 102. Further, an adhesive/release layer 703 is provided so as to cover the intermediate transfer substrate 701 and the light absorbers 702.

Then, as illustrated in FIG. 7, after the light absorbers 702 and the protection films 601 are aligned with each other, the adhesive/release layer 703 and the protection films 601 are bonded to each other. Subsequently, the element formation substrate 401 is etched with the use of a mixture solution of hydrofluoric acid and a surfactant in a state in which side surfaces of edge portions of the intermediate transfer substrate 701 are protected by a tape or the like. Note that the etching is adjusted not to go beyond the etching stopper layer 402.

The thin film transistors 102 can be thus transferred from the element formation substrate 401 onto the intermediate transfer substrate 701.

The following describes the transfer process of transferring the thin film transistors 102 from the intermediate transfer substrate 701 onto the substrate 301.

As illustrated in FIG. 7, signal lines 104 and scanning lines 105 are provided on the substrate 301. An interlayer insulating film 302 for insulating the signal lines 104 from the scanning lines 105 is formed so as to cover the signal lines 104. Further, a planarizing film 303 is formed so as to cover the scanning lines 105 and the interlayer insulating film 302.

Note that a contact portion 201 is formed in part of a region above each of the signal lines 104.

Then, an adhesive layer 1501 for bonding a thin film transistor 102 to be transferred is formed on the planarizing film 303.

As illustrated in FIG. 7, the position of the intermediate transfer substrate 701 is adjusted so that the intermediate transfer substrate 701 is located above the adhesive layer 1501, and the thin film transistor 102 to be transferred is bonded to the adhesive layer 1501.

Then, an upper portion of the thin film transistor 102 to be transferred is selectively irradiated with light through the intermediate transfer substrate 701, so as to heat the light absorber 702. The heat reduces adhesion of the adhesive/release layer 703, thereby separating the thin film transistor 102 from the intermediate transfer substrate 701. As a result, the thin film transistor 102 is bonded to the substrate 301 side.

Thereafter, an ITO film is patterned to simultaneously form a connecting electrode 203, which is for connecting the signal line 104 and the thin film transistor 102, and a pixel electrode 103. In this way, an active matrix substrate 101 is produced.

FIG. 8 is a diagram illustrating an outline configuration of a liquid crystal display device including the active matrix substrate 101 produced by the process illustrated in FIG. 7.

As illustrated in FIG. 8, in the thin film transistor 102, the undercoat layer 305, a gate electrode 306, a gate insulating film 307, a semiconductor layer 308, and a channel protection insulating film 309 are laminated in this order. On a portion of the semiconductor layer 308 from which the channel protection insulating film 309 is removed, an n-type semiconductor layer 310 is provided. On the n-type semiconductor layer 310, a source electrode 311 and a drain electrode 312 are provided. On the source electrode 311 and the drain electrode 312, a passivation film 313 is provided. Further, contact holes 314 are provided in portions corresponding to the source electrode 311 and the drain electrode 312. The active matrix substrate 101 obtained by the above process in which the thin film transistor 102 thus arranged is formed on an adhesive layer (not illustrated) is combined with a counter glass substrate 2403 on which a color filter 2401 and a counter electrode 2402 are provided. Further, a liquid crystal layer 2404 is injected between the two substrates 101 and 2403. In this way, the liquid crystal display device can be produced.

As described above, in such a liquid crystal display device including the active matrix substrate 101 produced by the transfer process, high-performance elements can be provided at low cost. Moreover, semiconductor elements formed by using a high temperature process can be provided on a film substrate which has low heat resistance.

CITATION LIST

Patent Literature 1

Japanese Patent Application Publication, Tokukai, No. 2001-7340 A (Publication Date: Jan. 12, 2001)

Patent Literature 2

Japanese Patent Application Publication, Tokukai, No. 2003-289136 A (Publication Date: Oct. 10, 2003)

Patent Literature 3

Japanese Patent Application Publication, Tokukaihei, No. 11-142878 A (Publication Date: May 28, 1999)

Patent Literature 4

Japanese Patent Application Publication, Tokukai, No. 2002-118124 A (Publication Date: Apr. 19, 2002)

SUMMARY OF INVENTION

Technical Problem

However, as illustrated in FIG. 8, thickness of the thin film transistor 102 is as large as hundreds of nanometers in a case where thickness of the pixel electrode 103 and the connecting electrode 203 is added. Moreover, the thickness of the thin film transistor 102 is as large as several micrometers in a case where thickness of the adhesive layer (not illustrated) is further added.

According to the configuration of the active matrix substrate 101, there is a large difference in level between (i) a region in which the thin film transistor 102 is formed on the adhesive layer (not illustrated) and (ii) a region in which the adhesive layer (not illustrated) and the thin film transistor 102 are not formed. As such, there is a problem that the pixel electrode 103 and the connecting electrode 203 that are provided so as to straddle over these two regions are likely to have defects such as step disconnection.

Further, the above step (see FIG. 7) of etching the element formation substrate 401 with the use of a mixture solution of hydrofluoric acid and a surfactant is likely to cause a variation in thickness of the thin film transistors 102 formed on the intermediate transfer substrate 701. Furthermore, variation in thickness is likely to occur also in the adhesive layers 1501 formed on the substrate 301. Accordingly, it is difficult to achieve uniformity in height of the thin film transistors 102 of the active matrix substrate 101.

As described above, in the active matrix substrate 101 produced by a conventional method, there is a large difference in level between the region in which the thin film transistor 102 is formed and the region in which the thin film transistor 102 is not formed and the heights of the thin film transistors 102 are not uniform. This undesirably causes a decline in yield and a decline in display quality.

The present invention was attained in view of the above problems, and an object of the present invention is to provide (i) a process, for producing a semiconductor device, which makes it possible to suppress a decline in yield, (ii) a semiconductor device produced by the process, and (iii) a display device including the semiconductor device.

Solution to Problem

In order to attain the above object, a process of the present invention for producing a semiconductor device includes the steps of: (a) forming a plurality of elements on a first substrate; and (b) selectively transferring the plurality of elements formed on the first substrate onto a second substrate via one or more intermediate transfer substrate; in the step (a), a connection surface being formed on at least one surface of each of the plurality of elements, the connection surface being a surface in which a terminal of the element that is to be electrically connected to wires of the element is formed, the step (b) further including the step of (c) selectively transferring the plurality of elements from the intermediate transfer substrate onto the second substrate, in the step (c), the plurality of elements formed on the intermediate transfer substrate being selectively transferred onto the second substrate by pressing one of the intermediate transfer substrate and the second substrate onto the other one of the intermediate transfer substrate and the second substrate so that the connection surface formed on one surface of an element to be transferred onto the second substrate out of the plurality of elements formed on the intermediate transfer substrate is located between a first surface of the second substrate and a second surface of the second substrate, the first surface of the second substrate being a surface on which the element is to be formed, and the second surface of the second substrate being a surface opposite to the first surface, the process further including the steps of: (d) forming, in the second substrate, a through-hole for allowing electrical connection between the wires and the connection surface located between the first surface of the second substrate and the second surface of the second substrate; and (e) forming the wires on the second surface of the second substrate.

According to a conventional process for producing a semiconductor device which includes the steps of: forming a plurality of elements on an element formation substrate; and selectively transferring, via one or more intermediate transfer substrates, the plurality of elements formed on the element formation substrate onto a substrate (corresponding to the second substrate) on which an element is finally formed, the element is provided on the substrate so that a connection surface of the element in which a terminal of the element that is to be connected to wires of the element is formed does not face an element formation surface of the substrate but faces an opposite direction (faces upwards). Accordingly, the wires are provided so as to straddle a region in which the element is formed and a region in which no element is formed.

Accordingly, there is a large difference in level between the region in which the element is formed and the region in which no element is formed. Consequently, step disconnection is likely to occur in the wires provided so as to straddle these regions.

Consequently, use of such a semiconductor device thus produced causes a decline in yield.

Meanwhile, according to the process of the present invention for producing a semiconductor device, in the step (c), the plurality of elements formed on the intermediate transfer substrate are selectively transferred onto the second substrate by pressing one of the intermediate transfer substrate and the second substrate onto the other one of the intermediate transfer substrate and the second substrate so that a connection surface formed on one surface of an element to be transferred onto the second substrate out of the plurality of elements formed on the intermediate transfer substrate is located between a first surface of the second substrate and a second surface of the second substrate, the first surface of the second substrate being a surface on which the element is to be formed, and the second surface of the second substrate being a surface opposite to the first surface.

Further, a through-hole for allowing electrical connection between the wires and the connection surface located between the first surface of the second substrate and the second surface of the second substrate is formed in the second substrate, and the wires are formed on the second surface of the second substrate.

Accordingly, the wires are formed not on the first surface of the second substrate but on the second surface of the second substrate which is a flat surface. This makes it possible to suppress occurrence of step disconnection or the like of the wires. Consequently, yield can be improved.

Further, according to the process of the present invention for producing a semiconductor device, the following effect can be produced in a case where the plurality of elements formed on the intermediate transfer substrate are selectively transferred onto the second substrate by pressing one of the intermediate transfer substrate and the second substrate onto the other one of the intermediate transfer substrate and the second substrate so that a connection surface formed on one surface of an element to be transferred is located between a first surface of the second substrate and a second surface of the second substrate, the first surface of the second substrate being a surface on which the element is to be formed, and the second surface of the second substrate being a surface opposite to the first surface (i.e., in a case where the plurality of elements are selectively transferred so that the connection surface formed on the one surface of the element to be transferred is embedded into the second substrate).

In the case where the element is transferred so that the connection surface formed on the one surface of the element is embedded into the second substrate, adhesion becomes higher since the connection surface is embedded into the second substrate, as compared with a case where the element is transferred so that the connection surface is formed on the second substrate. Accordingly, it is possible to suppress occurrence of a transfer defect which can occur when the intermediate transfer substrate is detached. Consequently, yield can be improved.

Moreover, in the case where the element is transferred so that the connection surface is formed on the second substrate, it is necessary to form a through-hole which completely penetrates the second substrate. Accordingly, it takes time to form the through-hole.

Meanwhile, in the case where the element is transferred so that the connection surface formed on the one surface of the element is embedded into the second substrate, it is possible to make the through-hole less deep by an amount corresponding to the embedded depth of the connection surface into the second substrate. This makes it possible to shorten a period of time required for the formation of the through-hole. As a result, productivity can be improved.

In order to attain the above object, a semiconductor device of the present invention is a semiconductor device produced by the above process.

Use of the semiconductor device makes it possible to suppress a decline in yield.

In order to attain the above object, a display device of the present invention includes a semiconductor device produced by the above process, at least one of the wires being a pixel electrode.

The display device includes the semiconductor device in which one or more transistors or a circuit including one or more transistors are formed by the transfer process. Since the pixel electrode can be formed so as to have a flat shape, it is possible to provide a display device which makes it possible to suppress a decline in yield and a decline in display quality.

Advantageous Effects of Invention

As described above, according to the process of the present invention for producing a semiconductor device, in the step (a), a connection surface being formed on at least one surface of each of the plurality of elements, the connection surface being a surface in which a terminal of the element that is to be electrically connected to wires of the element is formed, the step (b) further including the step of (c) selectively transferring the plurality of elements from the intermediate transfer substrate onto the second substrate, in the step (c), the plurality of elements formed on the intermediate transfer substrate being selectively transferred onto the second substrate by pressing one of the intermediate transfer substrate and the second substrate onto the other one of the intermediate transfer substrate and the second substrate so that the connection surface formed on one surface of an element to be transferred onto the second substrate out of the plurality of elements formed on the intermediate transfer substrate is located between a first surface of the second substrate and a second surface of the second substrate, the first surface of the second substrate being a surface on which the element is to be formed, and the second surface of the second substrate being a surface opposite to the first surface, the process further including the steps of: (d) forming, in the second substrate, a through-hole for allowing electrical connection between the wires and the connection surface located between the first surface of the second substrate and the second surface of the second substrate; and (e) forming the wires on the second surface of the second substrate.

As described above, the semiconductor device of the present invention is produced by the above process.

As described above, the display device of the present invention includes a semiconductor device produced by the above process, at least one of the wires being a pixel electrode.

It is therefore possible to provide (i) a process, for producing a semiconductor device, which makes it possible to suppress a decline in yield, (ii) a semiconductor device produced by the process, and (iii) a display device including the semiconductor device.

DESCRIPTION OF EMBODIMENTS

Embodiments of the present invention are described below in detail with reference to the drawings. Note, however, that dimensions, materials, shapes, relative positions, etc. of the constituent members described in Embodiments of the present invention are merely illustrative examples, and the scope of the invention should not be narrowly interpreted within limits of such examples.

Embodiment 1

The present embodiment discusses a liquid crystal display device as an example of a display device which includes a display device use substrate (semiconductor device) produced by the process of the present invention in which one or more transistor (hereinafter referred to as TFT) is formed by a transfer process. Note, however, that the present embodiment is not limited to this.

The present embodiment deals with an example in which one or more TFT is formed by a transfer process with the use of the process of the present invention. Note, however, that the present embodiment is not limited to this. Needless to say, a circuit including one or more TFT or an element such as a light-emitting element, a light-receiving element, a pressure sensor element, or an power generation element may be formed by the transfer process.

Figure 1:
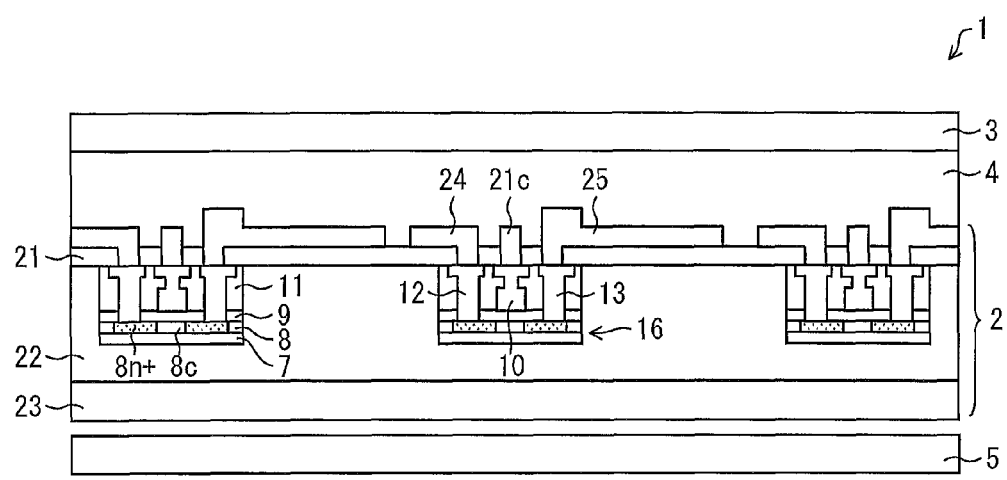
FIG. 1 is a diagram illustrating an outline configuration of a liquid crystal display device of an embodiment of the present invention.
Figure 2:
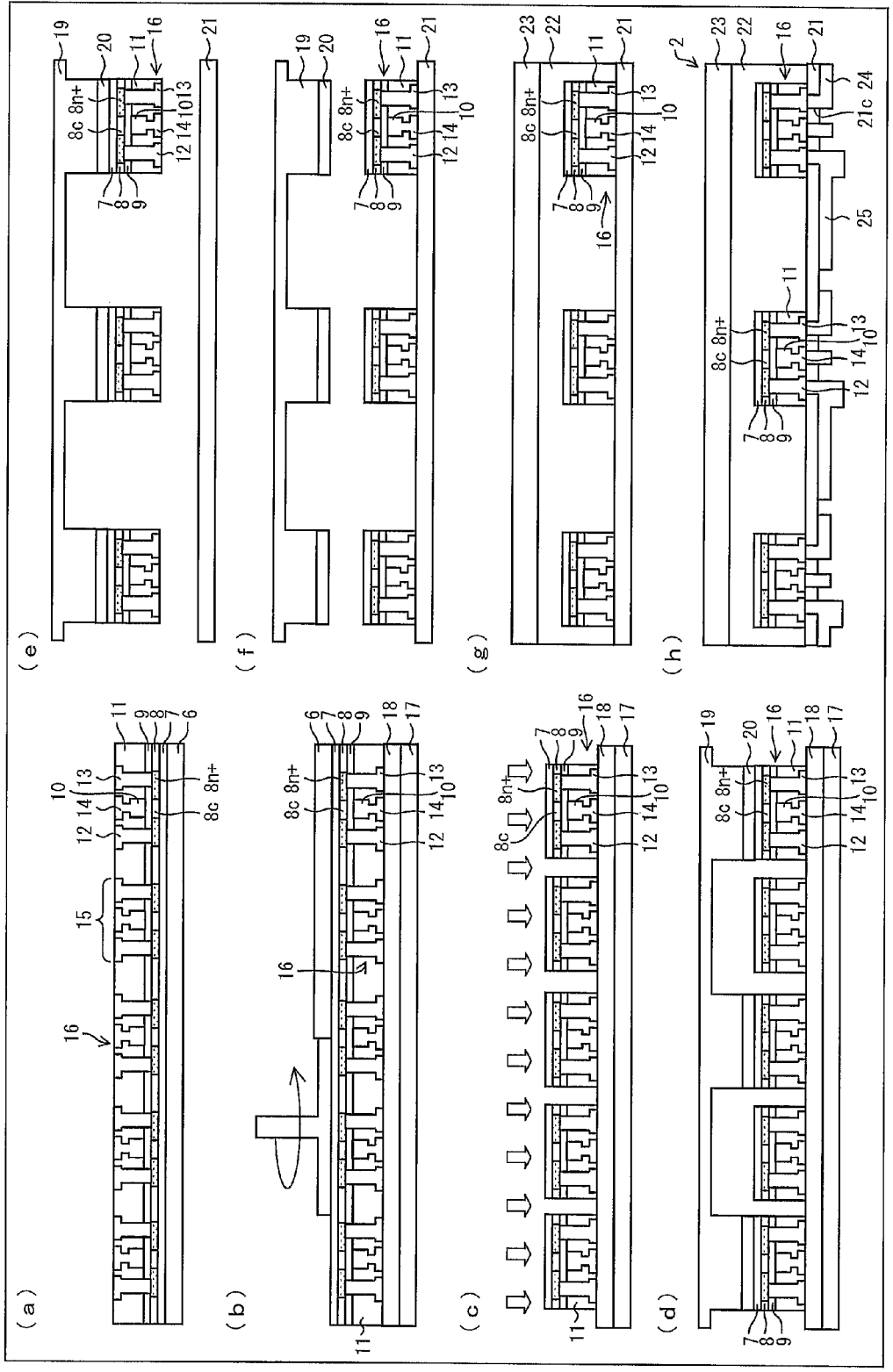
FIG. 2 is a diagram illustrating an outline configuration of an active matrix substrate provided in the liquid crystal display device of the embodiment of the present invention and a process for producing the active matrix substrate.

The following describes an outline configuration of a liquid crystal display device 1, an outline configuration of an active matrix substrate 2 provided in the liquid crystal display device 1, and a process for producing the active matrix substrate 2 with reference to FIGS. 1 and 2.

FIG. 2 is a diagram illustrating the outline configuration of the active matrix substrate 2 provided in the liquid crystal display device 1 and the process for producing the active matrix substrate 2.

First, in the present embodiment, TFTs 16 are formed on a SOI (Si On Insulator) wafer which serves as a first substrate and which includes a Si wafer 6, an insulating layer 7, and a monocrystalline Si layer 8 laminated in this order (see (a) of FIG. 2).

Note that the TFTs 16 are preferably formed on the SOI wafer so that size and pitch of the TFTs 16 are an integral submultiple of a pixel pitch of the liquid crystal display device 1 which is a final product.

This makes alignment in a transfer process (later described) easy.

In the present embodiment, the first substrate is a SOI wafer. However, the first substrate is not limited to this, and can be, for example, a monocrystalline Si wafer.

In the present embodiment, the monocrystalline Si layer 8 is used as a semiconductor layer on which the TFTs 16 are provided. However, the semiconductor layer on which the TFTs 16 are provided is not limited to this, and can be, for example, an amorphous silicon layer, a polycrystalline silicon layer, an amorphous germanium layer, an amorphous silicon/germanium layer, or an amorphous silicon/carbide layer.

The following describes a configuration of each of the TFTs 16 formed on the SOI wafer.

Note that the configuration of the TFT 16 is an example, and is not limited to this.

As illustrated in (a) of FIG. 2, the TFT 16 includes (i) a channel region $8c$ formed from the monocrystalline Si layer 8, (ii) n+ regions $8n+$ which sandwich the channel region $8c$ and which is formed by implanting an impurity such a P (phosphorus) into the monocrystalline Si layer 8, and (iii) a gate insulating film 9 that is provided so as to cover the channel region $8c$ and the n+ regions $8n+$. On the gate insulating film 9, a gate electrode 10 is provided so as to overlap the channel region $8c$ in a plan view.

Further, an interlayer insulating film 11 is provided so as to cover the gate insulating film 9 and the gate electrode 10. In the interlayer insulating film 11, a first contact hole for allowing electrical connection between a source electrode 12 and one of the n+ regions $8n+$ which are provided so as to sandwich the channel region $8c$, a second contact hole for allowing electrical connection between a drain electrode 13 and the other one of the n+ regions $8n+$, and a third contact hole for allowing electrical connection between a terminal 14 and the gate electrode 10.

As illustrated in (a) of FIG. 2, the TFT 16 has a connection surface 15 in which the terminals (the source electrode 12, the drain electrode 13, and the terminal 14 connected to the gate electrode 10) of the TFT 16 which are electrically connected to wires of the TFT 16 are formed.

In the present embodiment, as illustrated in (a) of FIG. 2, the TFT 16 is formed on the SOI wafer so that the connection surface 15 of the TFT 16 is present on a surface of the TFT 16 which surface is opposite to a surface that is in contact with the SOI wafer.

Next, as illustrated in (b) of FIG. 2, the SOI wafer on which the TFTs 16 are provided (see (a) of FIG. 2) is bonded to a supporting substrate 17 (first intermediate transfer substrate) on which an adhesive sheet 18 is provided. Then, the Si wafer 6, which is a bottom layer of the SOI wafer, is ground away by a polishing device or a CMP (Chemical Mechanical Polishing) device, thereby thinning the SOI wafer.

In the present embodiment, the adhesive sheet 18 is provided on the supporting substrate 17 (first intermediate transfer substrate). Note, however, that such an adhesive provided on the supporting substrate 17 (first intermediate transfer substrate) is not limited to a sheet-like adhesive, and can be an adhesive layer.

The above thinning step is carried out in order to shorten a period of time taken for a dry-etching step (later described) for separating the TFTs 16 and improve productivity. However, the thinning step can be omitted appropriately.

Next, a resist (not illustrated) is formed only in regions in which the TFTs 16 are formed. Then, the insulating layer 7, the monocrystalline Si layer 8, the gate insulating film 9, and the interlayer insulating film 11 are dry-etched by using the resist as a mask. The TFTs 16 are thus separated from each other, as illustrated in (c) of FIG. 2.

Then, a mold 19 (second intermediate transfer substrate) illustrated in (d) of FIG. 2 is prepared. The mold 19 is a transparent member such as quartz or a metal such as Ni, and is for selectively picking up the TFTs 16 thus separated from each other.

In the present embodiment, an adhesive sheet 20 is provided, as an adhesive layer whose adhesion changes by heat or application of UV light, on a projection of the mold 19 which corresponds to a TFT 16 to be picked up, as illustrated in (d) of FIG. 2. However, such an adhesive is not limited to a sheet-like adhesive, and can be an adhesive layer.

Note that in a case where it is necessary to apply UV light through the mold 19, it is preferable that the mold 19 be a transparent member, such as quartz, which can transmit UV light.

As illustrated in (d) of FIG. 2, after the projection of the mold 19 is aligned with the TFT 16 to be picked up out of the plurality of TFTs 16 formed on the supporting substrate 17, the projection of the mold 19 is made in close contact with the TFT 16 to be picked up. Then, only the TFT 16 to be picked up is detached from the supporting substrate 17.

Note that it is preferable that the adhesive sheets 18 and 20 be selected so that adhesion a of the adhesive sheet 18 provided on the supporting substrate 17 and adhesion b of the adhesive sheet 20 provided on the mold 19 satisfy b>a.

In a case where the adhesion a of the adhesive sheet 18 provided on the supporting substrate 17 and the adhesion b of the adhesive sheet 20 provided on the mold 19 are the same, it is preferable that the adhesion a of the adhesive sheet 18 provided on the supporting substrate 17 be reduced to be lower than the adhesion b of the adhesive sheet 20 provided on the mold 19, for example, by applying heat or UV light to the supporting substrate 17 in advance.

Next, as illustrated in (e) of FIG. 2, a supporting substrate 21 (second substrate) of the active matrix substrate 2 provided in the liquid crystal display device 1 is prepared. Then, the TFT 16 picked up from the supporting substrate 17 is bonded to the supporting substrate 21.

The supporting substrate 21 is not limited to a specific one, provided that it is sufficiently thin to the extent that a contact hole 21c (through-hole) can be formed from a rear surface of the supporting substrate 21 in a later step (later described). However, the supporting substrate 21 is preferably a resin film made of a resin such as plastic or polyimide.

The TFT 16 may be bonded to the supporting substrate 21 with the use of an adhesive. Alternatively, in a case where the supporting substrate 21 is made of a thermoplastic resin or the like, the TFT 16 can be bonded to the supporting substrate 21 without the use of an adhesive by applying heat to the supporting substrate 21.

In the present embodiment, the supporting substrate 21 is made of a thermoplastic resin.

Next, as illustrated in (f) of FIG. 2, the mold 19 is removed from the TFT 16. It is preferable that the supporting substrate 21 and the adhesive sheet 20 provided on the mold 19 be selected so that adhesion c between the supporting substrate 21 and the TFT 16 and the adhesion b between the mold 19 and the TFT 16 satisfy c>b.

Alternatively, the adhesion c and the adhesion b may be adjusted so that c>b is satisfied by applying heat or UV light to the mold 19 side.

In the present embodiment, the adhesion c and the adhesion b are adjusted so that c>b is satisfied by applying UV light to the adhesive sheet 20, whose adhesion declines due to application of UV light, through the mold 19 made of quartz that can transmit UV light.

As illustrated in (f) of FIG. 2, a top surface of the TFT 16 is exposed. Accordingly, a resin layer 22 is applied so as to cover the entire surface again as illustrated in (g) of FIG. 2. Then, a final support substrate such as a plastic substrate 23 is bonded onto the resin layer 22. Note that the plastic substrate 23 is not necessarily needed. In a case where sufficient strength can be obtained only by the resin layer 22, it is unnecessary to provide the plastic substrate 23.

Finally, as illustrated in (h) of FIG. 2, a contact hole 21c for allowing electrical connection between the wires of the TFT 16 and the terminals (the source electrode 12, the drain electrode 13, and the terminal 14 connected to the gate electrode 10) of the TFTs 16 is formed in the supporting substrate 21. Then, a wire 24 and a pixel electrode 25, each of which is made of a metal such as Al or a transparent electrode material such as ITO, are formed in a surface of the supporting substrate 21 which surface is opposite to a surface on which the TFT 16 is provided (surface opposite to a TFT element formation surface). In this way, the active matrix substrate 2 is produced.

As described above, in the present embodiment, the wire 24 and the pixel electrode 25 are formed on the flat surface of the supporting substrate 21 which surface is opposite to the surface on which the TFT 16 is provided, as illustrated in (h) of FIG. 2. Accordingly, the wire 24 and the pixel electrode 25 can have a flat shape regardless of the shape and height of the TFT 16.

Figure 3:
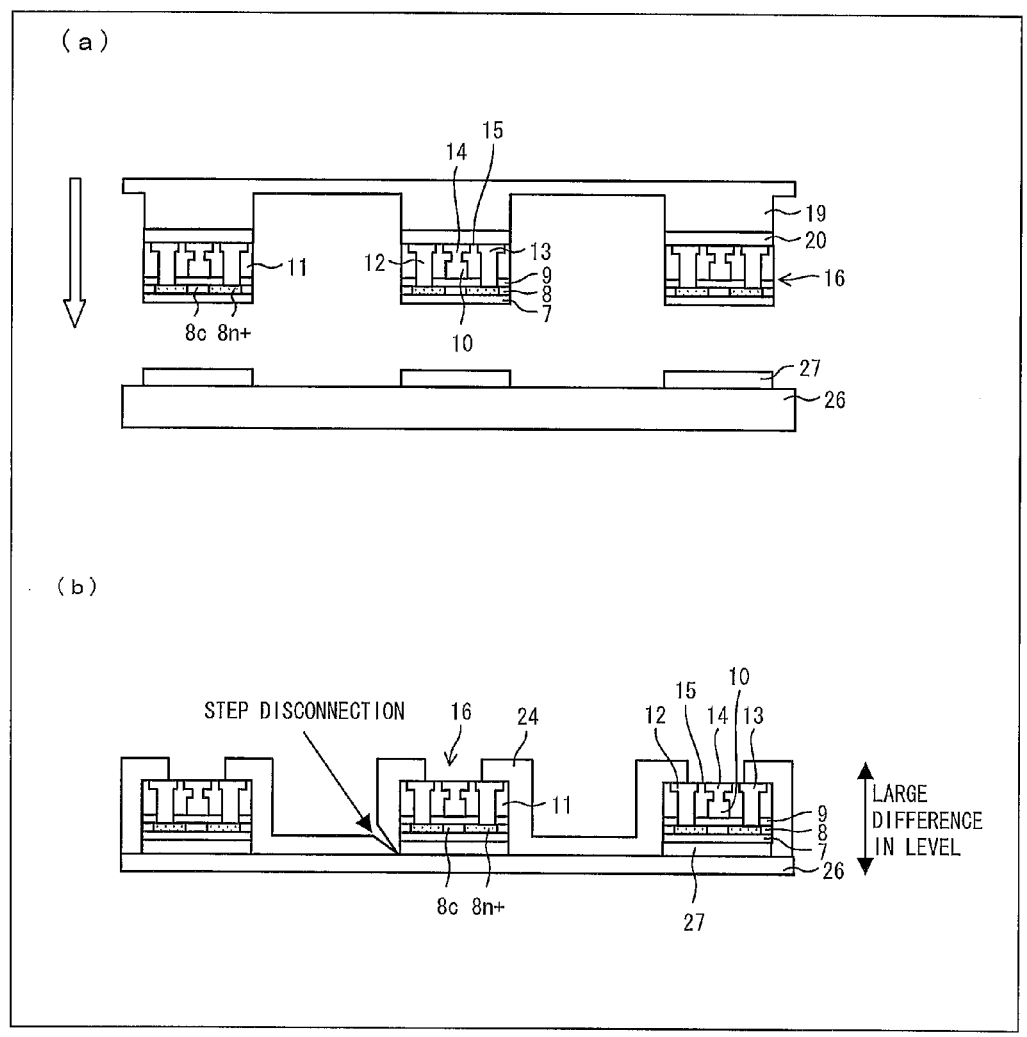
FIG. 3 is a diagram comparing the active matrix substrate provided in the liquid crystal display device of the embodiment of the present invention and an active matrix substrate produced by a conventional method.

With reference to FIG. 3, the following describes the configuration of the active matrix substrate 2 in more detail in comparison with an active matrix substrate produced by a conventional method.

According to the conventional method, a TFT 16 is bonded to a mold 19 so that an adhesive sheet 20 provided on a projection of the mold 19 and a connection surface 15 in which terminals (a source electrode 12, a drain electrode 13, and a terminal 14 connected to a gate electrode 10) of the TFT 16 are formed face each other (see (a) of FIG. 3).

As illustrated in (a) of FIG. 3, after the TFT 16 bonded to the mold 19 is aligned with an adhesive layer 27 formed on a supporting substrate 26, the TFT 16 is made in close contact with the adhesive layer 27. The TFT 16 is then transferred onto the supporting substrate 26 by applying heat or UV light to the adhesive sheet 20 so that adhesion between the supporting substrate 26 and the TFT 16 becomes larger than adhesion between the mold 19 and the TFT 16.

In the active matrix substrate produced by the conventional method, the TFT 16 is formed on the supporting substrate 26 so that the connection surface 15 of the TFT 16 is located on an opposite side to the supporting substrate 26 (see (b) of FIG. 3).

Accordingly, a wire 24 and a pixel electrode (not illustrated) are formed so as to straddle a region in which the TFT 16 is formed and a region in which the TFT 16 is not formed. Since a height of the TFT 16 including a height of the adhesive layer 27 is large, the wire 24 and the pixel electrode (not illustrated) are corrugated.

This causes step disconnection of the wire 24 and the pixel electrode (not illustrated). Moreover, since the pixel electrode (not illustrated) is corrugated, there arises a decline in display quality.

Meanwhile, in the active matrix substrate 2, the wire 24 and the pixel electrode 25 are formed on the flat surface of the supporting substrate 21 which surface is opposite to the surface on which the TFT 16 is provided (see (h) of FIG. 2). Accordingly, the wire 24 and the pixel electrode 25 can be provided so as to have a flat shape regardless of the shape and height of the TFT 16.

FIG. 1 is a diagram illustrating an outline configuration of the liquid crystal display device 1 including the active matrix substrate 2.

As illustrated in FIG. 1, the liquid crystal display device 1 includes (i) the active matrix substrate 2, (ii) a counter substrate 3 which faces the active matrix substrate 2 and on which a counter electrode (not illustrated) and a color filter layer (not illustrated) are provided, and (iii) a liquid crystal layer 4 which is provided between the two substrates 2 and 3 and which is sealed by a sealing material.

Further, the liquid crystal display device 1 includes a backlight 5 provided behind a back surface (the active matrix substrate 2 side) of the liquid crystal display panel. The backlight 5 emits light towards the liquid crystal display panel.

The liquid crystal display device 1 includes the active matrix substrate 2 in which the wire 24 and the pixel electrode 25 are provided so as to have a flat shape regardless of the shape and height of the TFT 16. Accordingly, step disconnection of the wire 24 can be prevented. Consequently, the liquid crystal display device 1 can be produced with high yield.

Further, the liquid crystal display device 1 can prevent even a decline in display quality which can occur in a case where the pixel electrode 25 cannot be provided so as to have a flat shape.

Although the present embodiment has dealt with, as an example, the liquid crystal display device 1 including the active matrix substrate 2 produced by the process illustrated in FIG. 2, the process illustrated in FIG. 2 can be also applied, for example, to a transfer process for a circuit including one or more TFT or an element such as a light-emitting element, a light-receiving element, a pressure sensor element, a power generation element, or the like.

Embodiment 2

Next, Embodiment 2 of the present invention is described below with reference to FIG. 4. The present embodiment is different from Embodiment 1 in that the TFT 16 is not bonded to a surface of the supporting substrate 21 but is embedded into the supporting substrate 21. The other configuration is identical to that described in Embodiment 1. For convenience of description, members that have identical functions to those described in the drawings of Embodiment 1 are given identical reference numerals, and are not explained repeatedly.

Figure 4:
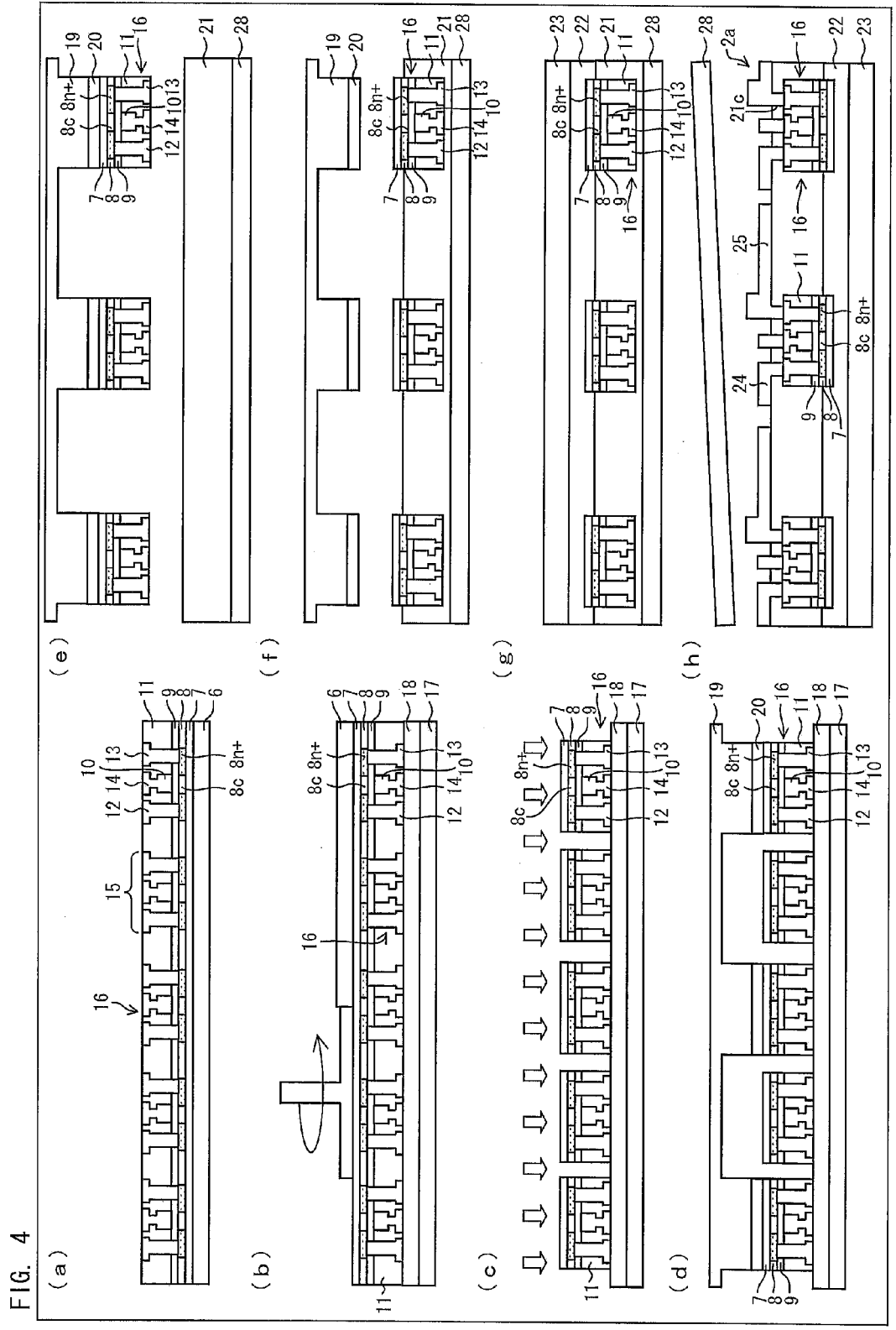
FIG. 4 is a diagram illustrating an outline configuration of an active matrix substrate provided in a liquid crystal display device of another embodiment of the present invention and a process for producing the active matrix substrate.

FIG. 4 is a diagram illustrating an outline configuration of an active matrix substrate 2a provided in a liquid crystal display device 1 and a process for producing the active matrix substrate 2a.

The steps in (a) through (d) of FIG. 4 are identical to those in (a) through (d) of FIG. 2, respectively, and therefore are not explained repeatedly.

Next, as illustrated in (e) of FIG. 4, a supporting substrate 21 made of a thermoplastic resin that is provided on a new supporting substrate 28 (third substrate) is prepared. Then, a TFT 16 bonded to a mold 19 is pushed into the supporting substrate 21 while applying heat to the supporting substrate 21. Thereafter, as illustrated in (f) of FIG. 4, the mold 19 is removed from the TFT 16 in a state in which the TFT 16 is embedded into the supporting substrate 21.

The TFT 16 may protrude from the supporting substrate 21 or may be pushed completely beneath a surface of the supporting substrate 21.

Here, adhesion between the supporting substrate 21 and the TFT 16 is made larger than adhesion between the mold 19 and the TFT 16. This may be achieved by curing the supporting substrate 21 so as to increase the adhesion between the supporting substrate 21 and the TFT 16 or may be achieved by applying heat or UV light to the adhesive sheet 20 formed on the mold 19 so as to reduce the adhesion between the mold 19 and the TFT 16.

The present embodiment deals with an arrangement in which the supporting substrate 21 made of a thermoplastic resin is provided on the new supporting substrate 28. However, the present embodiment is not limited to this. For example, a coating-type resin may be formed on the new supporting substrate 28.

In such a case, before the coating-type resin is completely solidified, the TFT 16 bonded to the mold 19 is pushed into the coating-type resin.

As illustrated in (f) of FIG. 4, a top surface of the TFT 16 is exposed. Accordingly, a resin layer 22 is applied so as to cover the entire surface again as illustrated in (g) of FIG. 4. Then, a final support substrate such as a plastic substrate 23 is bonded onto the resin layer 22. Note that the plastic substrate 23 is not necessarily needed. In a case where sufficient strength can be obtained only by the resin layer 22, it is unnecessary to provide the plastic substrate 23.

Finally, as illustrated in (h) of FIG. 4, UV light or a laser is applied from the supporting substrate 28 side so as to detach the supporting substrate 28 from the supporting substrate 21. A surface of the supporting substrate 21 which surface is in contact with the supporting substrate 28 is a flat surface with few irregularities. In this surface, a contact hole 21c for allowing connection between a wire of the TFT 16 and terminals (a source electrode 12, a drain electrode 13, and a terminal 14 connected to a gate electrode 10) of the TFT 16 is formed. Then, a wire 24 and a pixel electrode 25, each of which is made of a metal such as Al or a transparent electrode material such as ITO, are formed. In this way, the active matrix substrate 2a is produced.

According to the configuration illustrated in (h) of FIG. 2 in which the TFT 16 is bonded onto the supporting substrate 21, the adhesion between the TFT 16 and the supporting substrate 21 is not large. Accordingly, a transfer defect such that the TFT 16 is detached from the supporting substrate 21 when the mold 19 is removed from the TFT 16 would occur.

Meanwhile, according to the configuration of the present embodiment illustrated in (h) of FIG. 4 in which the TFT 16 is embedded into the supporting substrate 21, the adhesion between the TFT 16 and the supporting substrate 21 is large. Accordingly, it is possible to suppress such a transfer defect.

Further, according to the configuration illustrated in (h) of FIG. 2 in which the TFT 16 is bonded onto the supporting substrate 21, it takes time to form the contact hole 21*c* in the supporting substrate 21. However, according to the configuration of the present embodiment, it is possible to shorten a period of time taken for formation of the contact hole 21*c* since the TFT 16 is embedded into the supporting substrate 21. This allows an improvement in productivity.

Embodiment 3

Next, Embodiment 3 of the present invention is described below with reference to FIG. 5. The present embodiment is different from Embodiment 1 in that a connection surface 15*a* in which a source electrode 12 and a terminal 14 connected to a gate electrode 10 are formed and a connection surface 15*b* in which a drain electrode 13 is formed are separately provided on respective opposing surfaces of a TFT 29. The other configuration is identical to that described in Embodiment 1. For convenience of description, members that have identical functions to those in the drawings described in Embodiment 1 are given identical reference numerals, and are not explained repeatedly.

Figure 5:
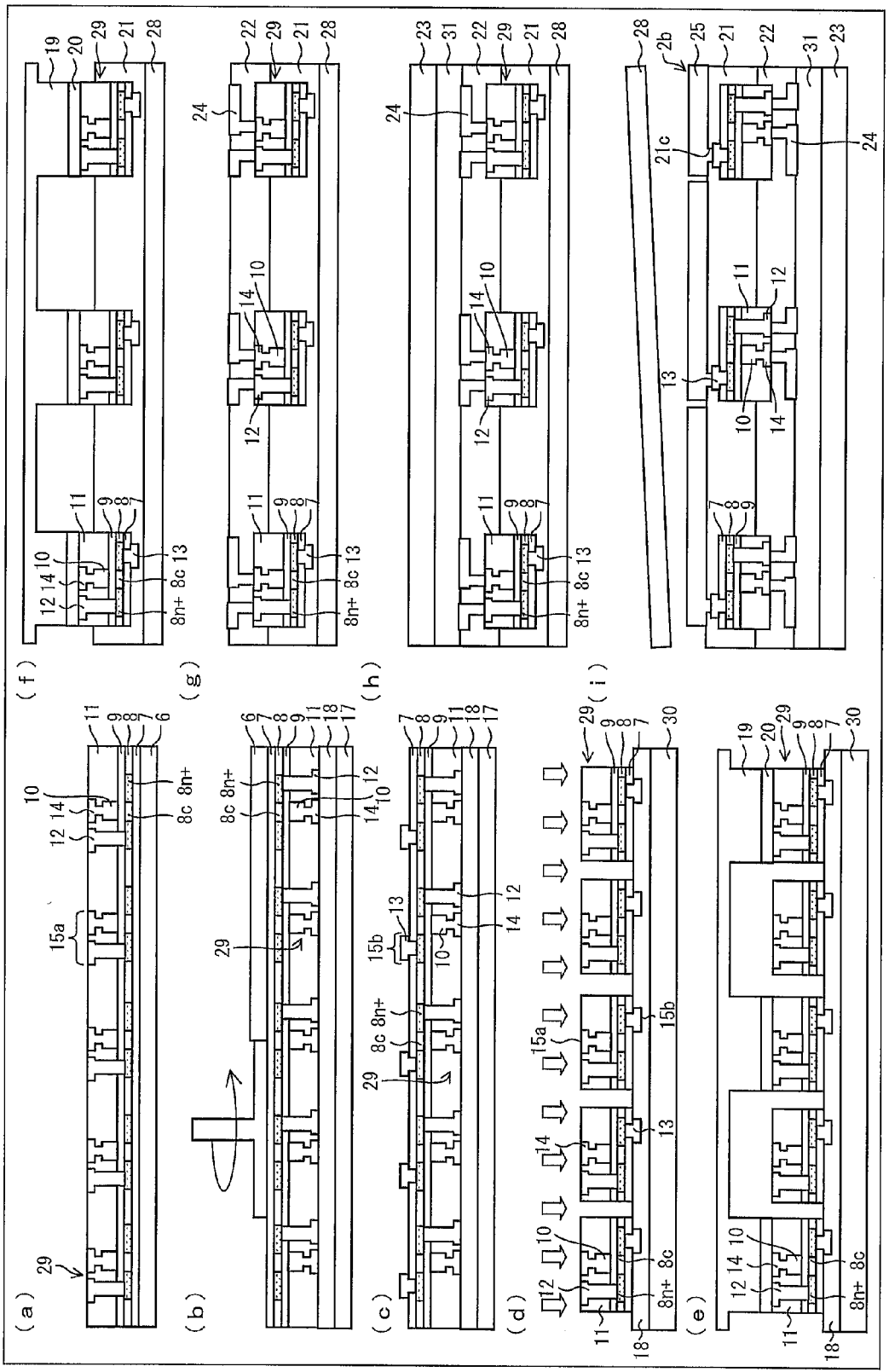
FIG. 5 is a diagram illustrating an outline configuration of an active matrix substrate provided in a liquid crystal display device of still another embodiment of the present invention and a process for producing the active matrix substrate.

FIG. 5 is a diagram illustrating an outline configuration of an active matrix substrate 2*b* provided in a liquid crystal display device 1 and a process for producing the active matrix substrate 2*b*.

In the present embodiment, as illustrated in (a) of FIG. 5, a SOI wafer in which a Si wafer 6, an insulating layer 7, and a monocrystalline Si layer 8 are laminated in this order is used. TFTs 29 are formed on the SOI wafer. Each of the TFT 29 is provided on the SOI wafer so that a connection surface 15*a* in which a source electrode 12 and a terminal 14 connected to a gate electrode 10 are formed is present on a surface of the TFT 29 which surface is opposite to a surface that is in contact with the SOI wafer.

That is, as illustrated in (a) of FIG. 5, no drain electrode 13 is formed at this stage.

Next, as illustrated in (b) of FIG. 5, the SOI wafer on which the TFT 29s are formed (see (a) of FIG. 5) is bonded to a supporting substrate 17 (first intermediate transfer substrate) on which an adhesive sheet 18 is provided. Then, the Si wafer 6, which is a bottom layer of the SOI wafer, is ground away by a polishing device or a CMP (Chemical Mechanical Polishing) device, thereby thinning the SOI wafer.

Then, as illustrated in (c) of FIG. 5, a drain electrode 13 is formed after a contact hole for allowing electrical connection between the drain electrode 13 and an n+ region 8*n*+ is formed in the insulating layer 7. Thus, a new connection surface 15*b* in which the drain electrode 13 is formed is formed on a surface of the TFT 29 which surface is opposite to the connection surface 15*a*.

Then, as illustrated in (d) of FIG. 5, the TFTs 29 are transferred onto a new supporting substrate 30 on which an adhesive sheet 18 is provided. Each of the TFTs 29 is transferred so that the connection surface 15*a* faces upward and the connection surface 15*b* faces downward. Thereafter, the TFTs 29 are separated from each other by dry-etching.

Subsequently, as illustrated in (e) of FIG. 5, a projection of a mold 19 on which an adhesive sheet 20 is provided is aligned with a TFT 29 to be picked up out of the plurality of TFTs 29 formed on the supporting substrate 30. After the projection of the mold 19 is made in close contact with the TFT 29 to be picked up, only the TFT 29 to be picked up is detached from the supporting substrate 30.

Next, as illustrated in (f) of FIG. 5, a supporting substrate 21 made of a thermoplastic resin that is provided on a supporting substrate 28 is prepared. The TFT 29 bonded to the mold 19 is pushed into the supporting substrate 21 while applying heat to the supporting substrate 21. Then, the mold 19 is removed from the TFT 29 in a state in which the TFT 29 is embedded into the supporting substrate 21.

Since a top surface of the TFT 29 is exposed in this state, a resin layer 22 is applied so as to cover the entire surface again as illustrated in (g) of FIG. 5. Subsequently, a contact hole is formed in the resin layer 22, and then a wire 24 to be connected to the source electrode 12 and the terminal 14 connected to the gate electrode 10 is formed.

Subsequently, as illustrated in (h) of FIG. 5, after a resin layer 31 is applied so as to cover the entire surface again, a final support substrate such as a plastic substrate 23 is bonded onto the resin layer 31. Note that the plastic substrate 23 is not necessarily needed. In a case where sufficient strength can be obtained only by the resin layer 31, it is unnecessary to provide the plastic substrate 23.

Finally, as illustrated in (i) of FIG. 5, the supporting substrate 28 is detached from the supporting substrate 21 by applying UV light or a laser from the supporting substrate 28 side.

Then, a contact hole 21*c* is formed in a flat surface of the supporting substrate 21 so as to be located in a region in which the drain electrode 13 is present. Subsequently, a pixel electrode 25 that is electrically connected to the drain electrode 13 is formed.

According to the configuration illustrated in (i) of FIG. 5, the wire 24 connected to the gate electrode 10 and the source electrode 12 is present not on a surface of the active matrix substrate 2*b* but inside the active matrix substrate 2*b*. This increases an area of the pixel electrode 25 on the surface of the active matrix substrate 2*b*, thereby enlarging a display region of the liquid crystal display device 1.

Further, it is possible to improve flexibility of layout of the wires since the connection surface 15*a* in which the source electrode 12 and the terminal 14 connected to the gate electrode 10 are formed and the connection surface 15*b* in which the drain electrode 13 is formed are provided on respective opposing surfaces of the TFT 29 that has been transferred.

Embodiment 4

Next, Embodiment 4 of the present invention is described below with reference to FIG. 6. The present embodiment is different from Embodiment 2 in that a supporting substrate 32 having projections is used. The other configuration is identical to that described in Embodiment 2. For convenience of description, members that have identical functions to those in the drawings described in Embodiment 2 are given identical reference numerals, and are not explained repeatedly.

Figure 6:
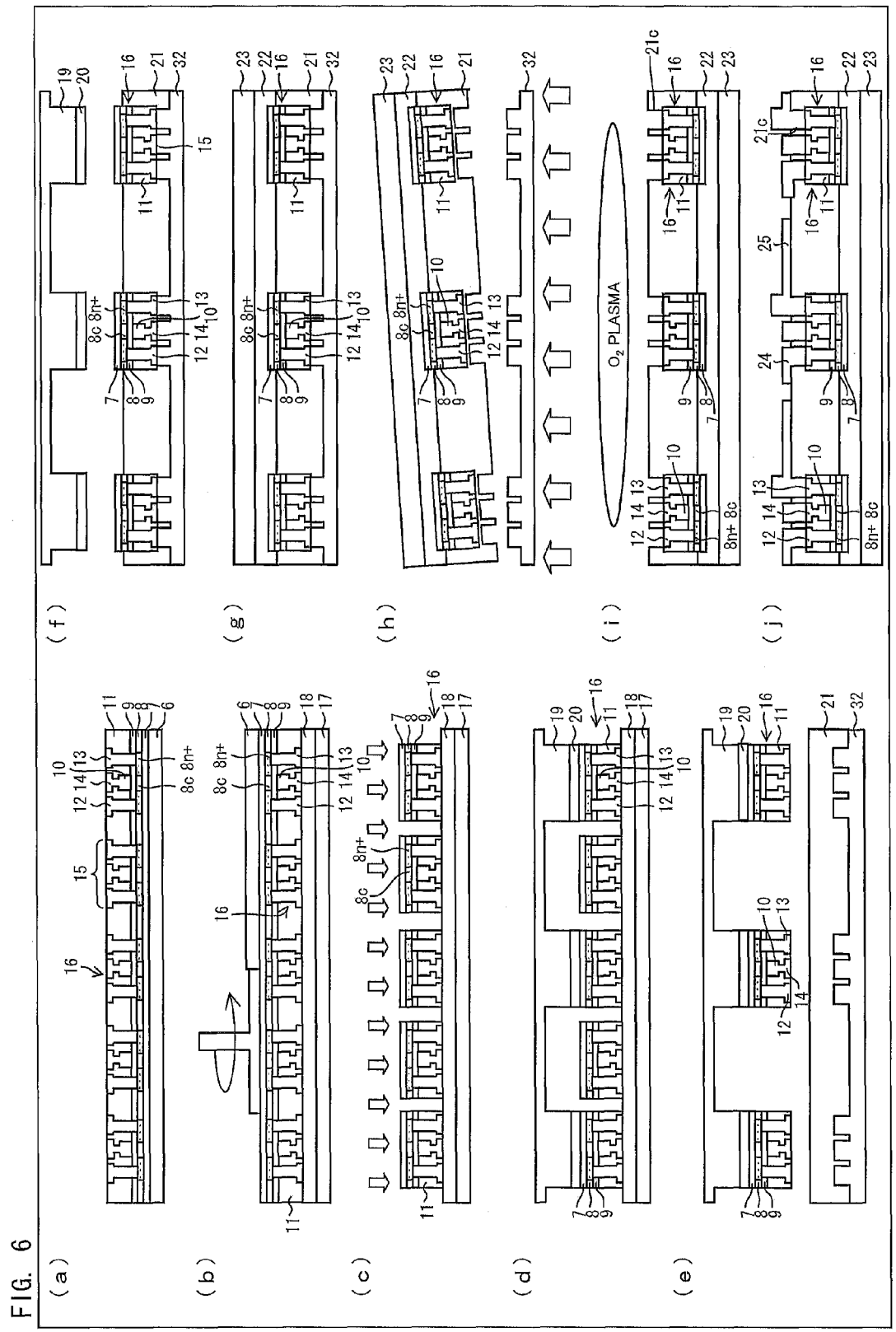
FIG. 6 is a diagram illustrating an outline configuration of an active matrix substrate provided in a liquid crystal display device of still another embodiment of the present invention and a process for producing the active matrix substrate.
Figure 7:
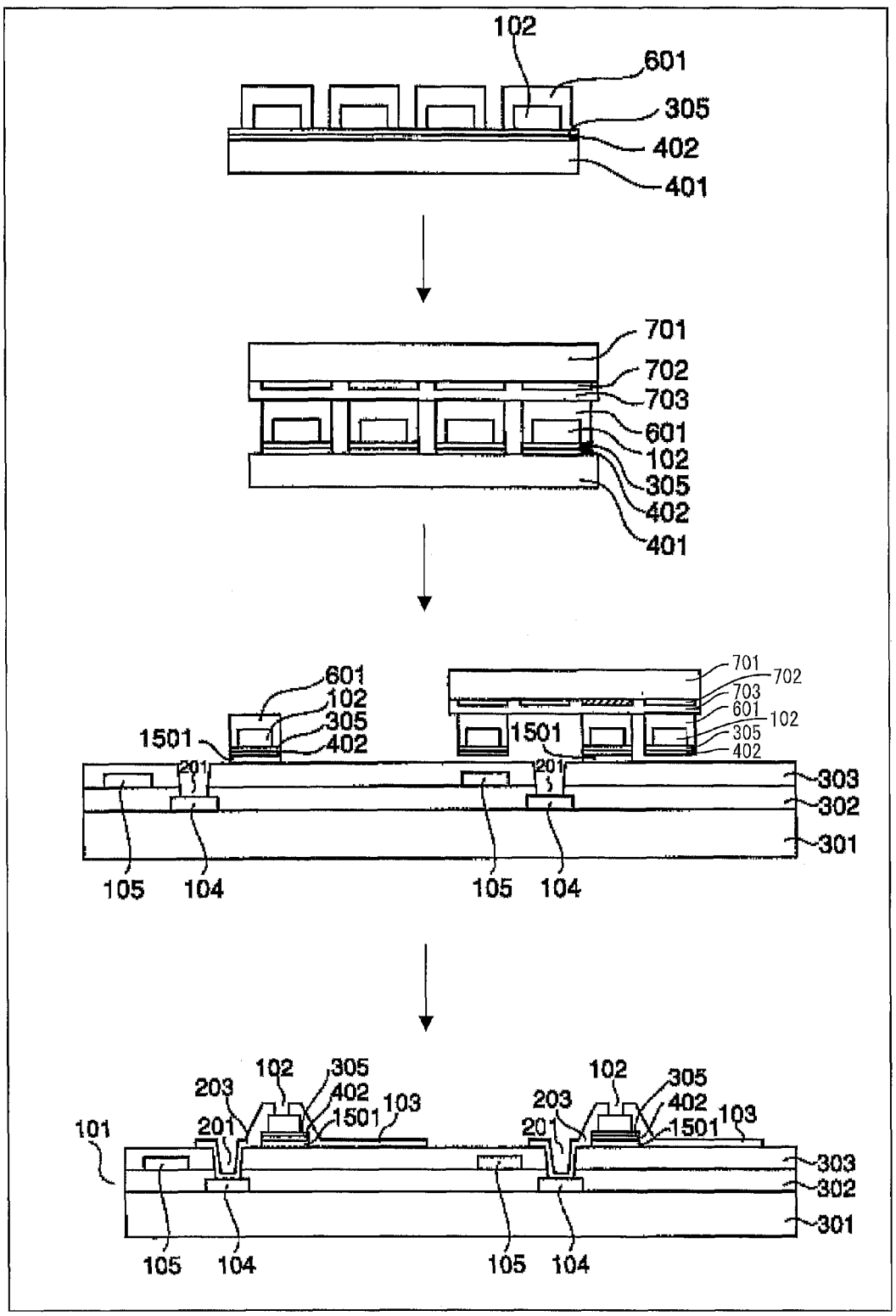
FIG. 7 is a diagram explaining a conventional process for transferring thin film transistors onto a substrate with the use of a transfer process.
Figure 8:
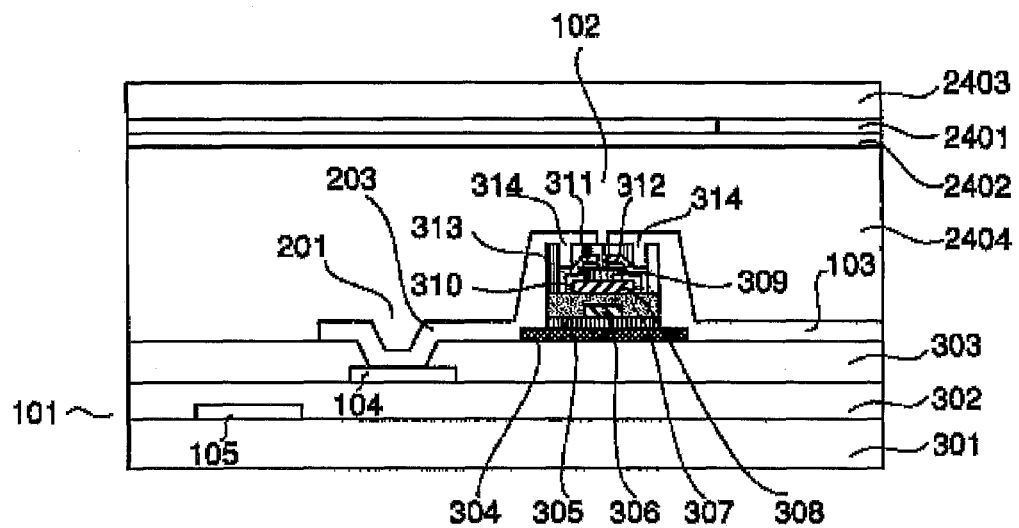
FIG. 8 is a diagram illustrating an outline configuration of a conventional liquid crystal display device including an active matrix substrate obtained by the process illustrated in FIG. 7.

FIG. 6 is a diagram illustrating an outline configuration of an active matrix substrate 2*c* provided in a liquid crystal display device 1 and a process for producing the active matrix substrate 2*c*.

The steps in (a) through (d) of FIG. 6 are identical to those in (a) through (d) of FIG. 2, respectively, and therefore are not explained repeatedly.

Next, as illustrated in (e) of FIG. 6, a supporting substrate 21 made of a thermoplastic resin is provided on a supporting substrate 32 (third substrate) having projections. A TFT 16 bonded to a mold 19 is pushed into the supporting substrate 21 while applying heat to the supporting substrate 21. Then, as illustrated in (f) of FIG. 6, the mold 19 is removed from the TFT 16 in a state in which the TFT 16 is embedded into the supporting substrate 21.

As illustrated in (f) of FIG. 6, the TFT 16 has a connection surface 15 in which terminals of the TFT 16 that are to be electrically connected to wires of the TFT 16 are formed. In the connection surface 15, a source electrode 12, a drain electrode 13, and a terminal 14 connected to a gate electrode 10 are formed at identical positions and in identical shapes to the projections formed on the supporting substrate 32.

It is preferable that the TFT 16 is pushed into the supporting substrate 21 in a state in which the source electrode 12, the drain electrode 13, and the terminal 14 connected to the gate electrode 10 which are formed in the connection surface 15 of the TFT 16 are aligned with the corresponding projections formed on the supporting substrate 32.

This makes it possible to more easily form a contact hole 21c in the supporting substrate 21.

Since a top surface of the TFT 16 is exposed in this state, a resin layer 22 is applied so as to cover the entire surface again as illustrated in (g) of FIG. 6. Then, a final support substrate such as a plastic substrate 23 is bonded onto the resin layer 22. Note that the plastic substrate 23 is not necessarily needed. In a case where sufficient strength can be obtained only by the resin layer 22, it is unnecessary to provide the plastic substrate 23.

Next, as illustrated in (h) of FIG. 6, the supporting substrate 32 is detached from the supporting substrate 21 by applying UV light or a laser from the supporting substrate 32 side. On a surface of the supporting substrate 21 which surface is in contact with the supporting substrate 32, concavities are formed in positions corresponding to the source electrode 12, the drain electrode 13, and the terminal 14 connected to the gate electrode 10.

Next, as illustrated in (i) of FIG. 6, a resin layer remaining in the concavities are removed by oxygen plasma treatment. Thus, the source electrode 12, the drain electrode 13, and the terminal 14 connected to the gate electrode 10 are exposed.

In the present embodiment, the resin layer remaining in the concavities are removed by oxygen plasma treatment. However, the resin layer remaining in the concavities may be removed by wet-etching.

Finally, as illustrated in (j) of FIG. 6, a wire 24 made of a metal such as Al is connected to the source electrode 12 and the terminal 14 connected to the gate electrode 10 which have been exposed and a pixel electrode 25 made of ITO or the like is connected to the drain electrode 13 which has been exposed. In this way, the active matrix substrate 2c is produced.

According to the configuration of (h) of FIG. 4 described in Embodiment 2, it is difficult to embed the TFT 16 to a fixed depth.

In a case where the embedded depth of the TFT 16 is shallow, it takes time to form the contact hole 21c in a later step. Meanwhile, in a case where the embedded depth of the TFT 16 is so deep that the TFT 16 reach the supporting substrate 28, the source electrode 12, the drain electrode 13, and the terminal 14 connected to the gate electrode 10 are exposed. This causes a decline in yield.

In contrast, according to the active matrix substrate 2c provided in the liquid crystal display device 1 of the present embodiment, the contact holes 21c can be formed in advance by the projections formed on the supporting substrate 32. This eliminates the need for a photolithography process for formation of the contact holes 21c. Consequently, productivity can be improved and cost can be reduced.

Further, according to the active matrix substrate 2c, the projections formed on the supporting substrate 32 can prevent the TFT 16 from being pushed into deeper than a predetermined depth. This allows an improvement in yield.

In the process of the present invention for producing a semiconductor device, it is preferable that the second substrate is made of a thermoplastic resin.

Since the second substrate is a thermoplastic resin, the element can be transferred onto the second substrate while applying heat to the second substrate or the element can be transferred onto the second substrate so that the element is embedded into the second substrate. This eliminates the need for an adhesive layer.

In the process of the present invention for producing a semiconductor device, it is preferable that the second substrate is formed on a third substrate, and the third substrate is detached from the second substrate before the through-hole and the wires are formed on the second substrate.

Since the second substrate is formed on the third substrate serving as a supporting substrate, a surface of the second substrate on which surface the wires are formed, i.e., a surface of the second substrate which surface is in contact with the third substrate can be made flatter.

This makes it possible to further suppress step disconnection of the wires formed on the second substrate. Consequently, yield can be improved.

In the process of the present invention for producing a semiconductor device, it is preferable that a projection is formed on a surface of the third substrate which surface is in contact with the second substrate, the projection causing the connection surface formed on the one surface of the element, to be transferred onto the second substrate out of the plurality of elements formed on the intermediate transfer substrate, to be located between the first surface of the second substrate and the second surface of the second substrate.

In a case where the connection surface of the element is embedded into the second substrate, it is difficult to embed the connection surface to a fixed depth.

In a case where the embedded depth is shallow, it takes time to form the through-hole. Meanwhile, in a case where the embedded depth is so deep that the connection surface of the element reaches the third substrate, the connection surface is exposed. This causes a reduction in yield.

According to the process for producing a semiconductor device, in a case where a connection surface formed on one surface of the element is embedded into the second substrate, the third substrate having a projection is used, so that it is possible to prevent the element from being embedded deeper than a predetermined depth.

In the process of the present invention for producing a semiconductor device, it is preferable that the projection formed on the third substrate and the terminal formed in the connection surface formed on the one surface of the element to be transferred overlap each other in a plan view.

Since the projection formed on the third substrate and the terminal formed in the connection surface of the element overlap each other in a plan view, the through-hole can be formed in advance by the projection formed on the third substrate. This eliminates the step for forming the through-hole, thereby improving productivity.

In the process of the present invention for producing a semiconductor device, it is preferable that each of the plurality of elements has (i) a first connection surface on a surface of the element which surface faces the first surface of the second substrate and (ii) a second connection surface on a surface of the element which surface is opposite to the surface facing the first surface of the second substrate, the first connection surface and the second connection surface each being a surface in which a terminal of the element that is to be electrically connected to wires of the element is formed.

According to the process for producing a semiconductor device, each of the plurality of elements has a connection surface, in which a terminal of the element that is to be connected to wires of the element is formed, on both two opposing surfaces of the element. This makes it possible to increase flexibility of layout of the wire and to relatively freely increase the width of the wires.

In the process of the present invention for producing a semiconductor device, it is preferable that the plurality of elements are one or more transistors or a circuit including one or more transistors.

According to the process for producing a semiconductor device, it is possible to produce a semiconductor device which includes the second substrate on which one or more transistors or a circuit including one or more transistors formed by the transfer process is provided. The semiconductor device thus produced makes it possible to suppress a decline in yield.

The semiconductor device may be, for example, a substrate for display device in which one or more transistors are formed by the above process, but is not limited to this.

In the process of the present invention for producing a semiconductor device, it is preferable that at least one of the plurality of elements is a light-emitting element.

According to the process for producing a semiconductor device, it is possible to produce a semiconductor device which includes the second substrate on which a light-emitting element formed by the transfer process is provided. The semiconductor device thus produced makes it possible to suppress a decline in yield.

The semiconductor device may be, for example, an illumination device including the second substrate on which the light-emitting element is provided, but is not limited to this.

In the process of the present invention for producing a semiconductor device, it is preferable that at least one of the plurality of elements is a light-receiving element.

According to the process for producing a semiconductor device, it is possible to produce a semiconductor device which includes the second substrate on which a light-receiving element formed by the transfer process is provided. The semiconductor device thus produced makes it possible to suppress a decline in yield.

The semiconductor device may be, for example, an optical sensor input device including the second substrate on which the light-receiving element is provided, but is not limited to this.

In the process of the present invention for producing a semiconductor device, it is preferable that at least one of the plurality of elements is a pressure sensor element.

According to the process for producing a semiconductor device, it is possible to produce a semiconductor device which includes the second substrate on which a pressure sensor element formed by the transfer process is provided. The semiconductor device thus produced makes it possible to suppress a decline in yield.

The semiconductor device may be, for example, a pressure sensor input device including the second substrate on which the pressure sensor element is provided, but is not limited to this.

In the process of the present invention for producing a semiconductor device, it is preferable that at least one of the plurality of elements is a power generation element.

According to the process for producing a semiconductor device, it is possible to produce a semiconductor device which includes the second substrate on which a power generation element formed by the transfer process is provided. The semiconductor device thus produced makes it possible to suppress a decline in yield.

The semiconductor device may be, for example, a solar cell sheet including the second substrate on which the power generation element is provided, but is not limited to this.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is applicable to semiconductor devices and display devices.

REFERENCE SIGNS LIST

1: Liquid crystal display device (semiconductor device, display device)
2, 2a, 2b, 2c: Active matrix substrate
6: Si wafer (first substrate)
8: Monocrystalline Si layer (first substrate)
12: Source electrode (terminal)
13: Drain electrode (terminal)
14: Terminal connected to gate electrode (terminal)
15: Connection surface
16: TFT (element)
17: Supporting substrate (intermediate transfer substrate)
19: Mold (intermediate transfer substrate)
21: Supporting substrate (second substrate)
21c: Contact hole (through-hole)
24: Wire
25: Pixel electrode (wire)
28: Supporting substrate (third substrate)
32: Supporting substrate (third substrate) having projection

The invention claimed is:

1. A process for producing a semiconductor device, comprising the steps of: (a) forming a plurality of elements on a first substrate; and (b) selectively transferring the plurality of elements formed on the first substrate onto a second substrate via one or more intermediate transfer substrate; in the step (a), a connection surface being formed on at least one surface of each of the plurality of elements, the connection surface being a surface in which a terminal of the element that is to be electrically connected to wires of the element is formed, the step (b) further including the step of (c) selectively transferring the plurality of elements from the intermediate transfer substrate onto the second substrate, in the step (c), the plurality of elements, which have been transferred from the first substrate to intermediate transfer substrate, are selectively transferred onto the second substrate by pressing the intermediate transfer substrate and the second substrate onto one another so that the connection surface formed on one surface of an element to be transferred onto the second substrate out of the plurality of elements formed on the intermediate transfer substrate is located between a first surface of the second substrate and a second surface of the second substrate, the first surface of the second substrate being a surface on which the element is to be formed, and the second surface of the second substrate being a surface opposite to the first surface, the process further comprising the steps of: (d) forming, in the second substrate, a through-hole for allowing electrical connection between the wires and the connection surface located between the first surface of the second substrate and the second surface of the second substrate; and (e) forming the wires on the second surface of the second substrate.

2. The process according to claim 1, wherein the second substrate is made of a thermoplastic resin.

3. The process according to claim 1, wherein:
the second substrate is formed on a third substrate, and
the third substrate is detached from the second substrate before the through-hole and the wires are formed on the second substrate.

4. The process according to claim 3, wherein a projection is formed on a surface of the third substrate which surface is in contact with the second substrate, the projection causing the connection surface formed on the one surface of the element, to be transferred onto the second substrate out of the plurality of elements formed on the intermediate transfer substrate, to be located between the first surface of the second substrate and the second surface of the second substrate.

5. The process according to claim 4, wherein the projection formed on the third substrate and the terminal formed in the connection surface formed on the one surface of the element to be transferred overlap each other in a plan view.

6. The process according to claim 1, wherein each of the plurality of elements has (i) a first connection surface on a surface of the element which surface faces the first surface of the second substrate and (ii) a second connection surface on a surface of the element which surface is opposite to the surface facing the first surface of the second substrate, the first connection surface and the second connection surface each being a surface in which a terminal of the element that is to be electrically connected to wires of the element is formed.

7. The process according to claim 1, wherein the plurality of elements are one or more transistors or a circuit including one or more transistors.

8. The process according to claim 1, wherein at least one of the plurality of elements is a light-emitting element.

9. The process according to claim 1, wherein at least one of the plurality of elements is a light-receiving element.

10. The process according to claim 1, wherein at least one of the plurality of elements is a pressure sensor element.

11. The process according to claim 1, wherein at least one of the plurality of elements is a power generation element.

* * * * *